(12) United States Patent
Blazick et al.

(10) Patent No.: US 6,238,741 B1
(45) Date of Patent: May 29, 2001

(54) SINGLE MASK SCREENING PROCESS

(75) Inventors: James M. Blazick, Marlboro; Michael E. Cropp, LaGrangeville; James N. Humenik, LaGrangevill; Gerald H. Leino, Walden; Jawahar P. Nayak, Wappingers Falls; Frank V. Ranalli, Rhinebeck; Deborah A. Sylvester, Poughkeepsie; John A. Trumpetto, Hopewell Junction; James C. Utter, Fishkill; Rao V. Vallabhaneni, Hopewell Junction; Renee L. Weisman, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/206,159

(22) Filed: Dec. 7, 1998

(51) Int. Cl.[7] .................................................... B05D 5/00
(52) U.S. Cl. ........................... 427/282; 427/97; 427/103; 427/123; 427/126.1; 427/402; 101/123; 101/129
(58) Field of Search .......................... 427/126.1, 79–81, 427/101–103, 282, 97, 402, 123; 101/123, 129

(56) References Cited

U.S. PATENT DOCUMENTS

| | | | |
|---|---|---|---|
| 4,025,669 | 5/1977 | Greenstein | 427/226 |
| 4,324,815 | 4/1982 | Mitani et al. | 427/96 |
| 5,202,153 | 4/1993 | Siuta | 427/125 |
| 5,293,504 | 3/1994 | Knickerbocker et al. | 174/262 |
| 5,393,696 | * 2/1995 | Koh et al. | 437/183 |
| 5,565,033 | 10/1996 | Gaynes et al. | 118/210 |
| 5,639,562 | 6/1997 | Natarajan et al. | 428/545 |
| 5,699,733 | * 12/1997 | Chang et al. | 101/129 |

* cited by examiner

Primary Examiner—Brian K. Talbot
(74) Attorney, Agent, or Firm—Ira D. Blecker

(57) ABSTRACT

A process of forming a multi-layer feature on a ceramic or organic article in which first and second layers of paste are sequentially screened through a screening mask wherein the screening mask has not been moved between screening steps. A structure produced by this process is also disclosed.

21 Claims, 3 Drawing Sheets

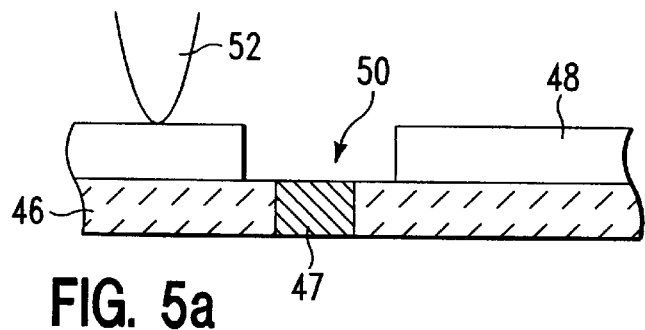
FIG. 5a
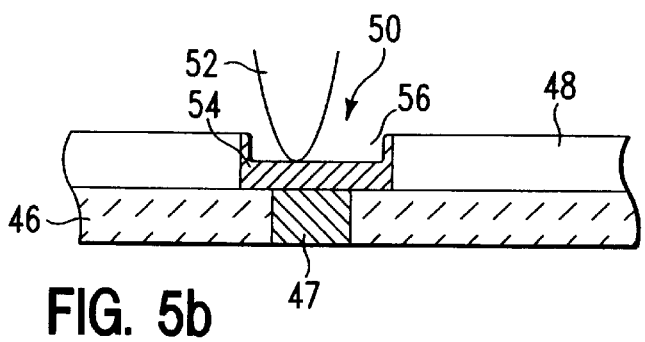
FIG. 5b
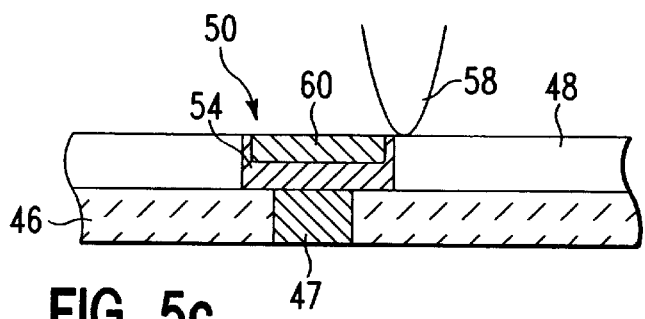
FIG. 5c
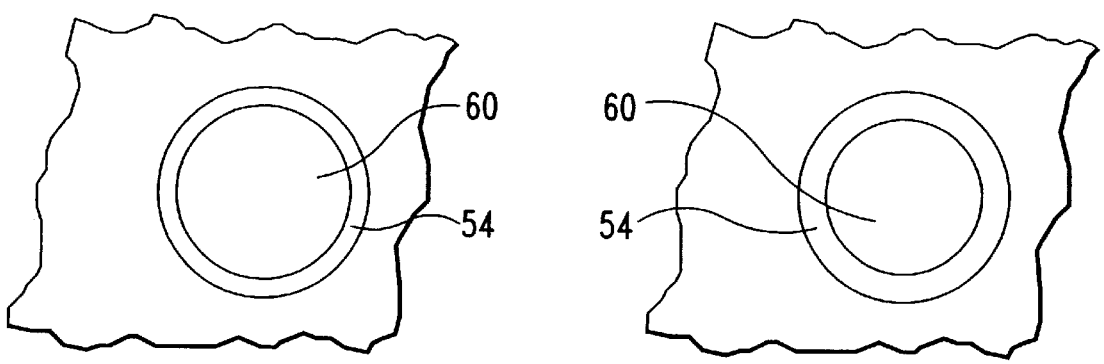
FIG. 6a
FIG. 6b

SINGLE MASK SCREENING PROCESS

RELATED APPLICATION

This application is related to Buechele et al. U.S. Patent Application Ser. No. 09/206,158 now U.S. Pat. No. 6,062,135 entitled "A SCREENING APPARATUS INCLUDING A DUAL RESERVOIR DISPENSING ASSEMBLY" (IBM Docket No. FI9-98-159), filed even date herewith, the disclosure of which is incorporated by reference herein.

BACKGROUND OF THE INVENTION

This invention relates to electronic substrates, and more particularly, relates to ceramic and organic substrates having multilayer features thereon for electronics packaging applications and a method for forming such multilayer features.

Glass, ceramic and glass ceramic (hereafter just ceramic) and organic structures are used in the production of electronic substrates and devices for electronics packaging applications. Many different types of structures can be used. For example, a multilayered ceramic circuit substrate may comprise patterned metal layers which act as electrical conductors sandwiched between ceramic layers which act as insulators. Organic substrates, also coalled printed circuit boards, may be single layer or multilayer material (such as fiberglass-impregnated epoxy) and contain electrical conductors. The substrates are designed with termination pads for attaching semiconductor chips, capacitors, resistors, connection leads, pins, solder balls, solder columns etc. Interconnection between buried conductor levels in ceramic substrates can be achieved through vias formed by metal paste-filled holes in the individual ceramic layers (called greensheets) formed prior to lamination, which, upon sintering will become a sintered dense metal interconnection of metal based conductor. In the case of organic substrates, interconnection between conductor levels is by, for example, plated through hole vias.

The termination pads are often multi-layered stacks of metallization and are conventionally produced with multiple screenings, with the underlying layer being screened and dried before application of another mask and screening and drying of the next layer. Greenstein U.S. Pat. No. 4,025,669, Siuta U.S. Pat. No. 5,202,153, and Knickerbocker et al. U.S. Pat. No. 5,293,504, the disclosures of which are incorporated by reference herein, are examples where multiple screenings have been utilized to obtain either a thicker layer or a multiple layer stack of metallization.

While the prior art shows the individual layers of the stack to be perfectly aligned with every other layer in the stack, the reality is very far from this ideal case. For example, Natarajan et al. U.S. Pat. No. 5,639,562, the disclosure of which is incorporated by reference herein, shows a two layer composite metal pad with both layers perfectly aligned.

Gaynes et al. U.S. Pat. No. 5,565,033, the disclosure of which is incorporated by reference herein, discloses a process for making thicker layers of solder pastes and conductive adhesives. Gaynes et al. recognizes the disadvantages of multiple screenings as contamination between successively screened layers and the time associated with two passes through screening and drying.

In practice, the individual layers may be shifted from the layer above or below it. Mitani et al. U.S. Pat. No. 4,324,815, the disclosure of which is incorporated by reference herein, recognizes the positional error that can occur with each printing step. As disclosed in Mitani et al., the bottom layer could be made larger than the top layer so that the top layer is "captured" by the bottom layer.

However, with the trend to increasing the density of the termination pads (and reducing the spacing between adjoining termination pads), it is no longer possible to oversize the bottom layer to capture the top layer. For example, a typical pin grid array substrate has a nominal pad diameter of 1.5 mm, an interpad space of 0.3 mm and a pad tolerance of +0/−0.220 mm. This is to be compared with a typical column grid array substrate which has a nominal pad diameter of 0.800 mm, an interpad space of 0.200 mm and a pad tolerance of +/−0.050 mm.

Accordingly, it is a purpose of the present invention to have an improved process for producing multilayer stacks of metallization on a ceramic article and/or organic article.

It is another purpose of the present invention to have an improved process for producing multilayer stacks of metallization on a ceramic article and/or organic article which eliminates the positional errors which heretofore have been inherent in multiple screenings of metallization.

It is yet another purpose of the present invention to have an improved process for producing multilayer stacks of metallization for use as termination pads, lines and other features.

BRIEF SUMMARY OF THE INVENTION

One aspect of the invention relates to a method of forming a multi-layer feature on an electronic substrate article, the method comprising the steps of:

a. placing a screening mask having at least one aperture over the electronic substrate article;

b. screening a first paste through the at least one aperture of the screening mask to form a first layer of the multi-layer feature;

c. screening a second paste through the same at least one aperture of the same screening mask used in the first screening step and onto the first paste to form a second layer of the multi-layer feature in alignment with the first layer of the multi-layer feature, wherein the screening mask has not been moved between the two screening steps; and d. removing the screening mask.

A second aspect of the invention relates to a multi-layer feature structure on an electronic substrate article comprising:

an electronic substrate article; and a multi-layer feature structure comprising:

a first portion adjacent to the electronic substrate article; and a second portion having a bottom and a periphery wherein the first portion contacts the bottom, and surrounds the periphery of, the second portion so that the second portion is captured by the first portion.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 5A, 5B and 5C are schematical cross-sectional views showing the different steps in producing the multilayer feature according to the present invention.

FIGS. 6A and 6B are top views of the multilayer feature produced according to the present invention.

DETAILED DESCRIPTION OF THE INVENTION

Figure 1:
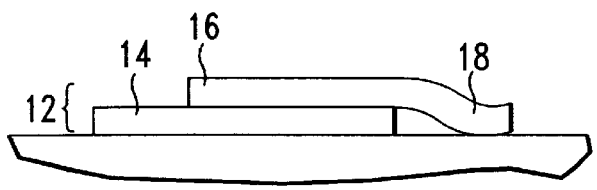
FIG. 1 is a side view of a prior art multilayer pad in which the top layer is misaligned with respect to the bottom layer.

Referring to the drawings in more detail, and particularly referring to FIG. 1, multilayer pad 12 has been formed on ceramic substrate 10. Due to positional error resulting from multiple screenings, top layer 16 is not aligned with bottom layer 14. The misalignment results in portion 18 of top layer 16 contacting ceramic substrate 10. The consequences of this structure are that a termination pad of reduced dimension has been formed and that if top layer does not bond well with ceramic substrate 10, the misalignment can cause delamination or spalling of top layer 16.

Figure 2:
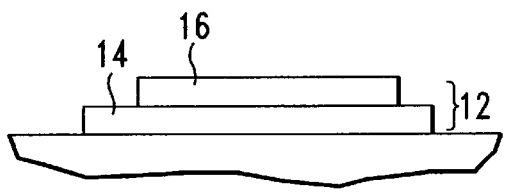
FIG. 2 is a side view of a prior art multilayer pad in which the bottom layer has been made larger to capture the top layer.

In FIG. 2, multilayer pad 12 on ceramic substrate 10 has been formed with bottom layer 14 larger than top layer 16. In this way, full contact between top layer 16 and bottom layer 14 is assured even if there is positional error from the multiple screenings. A disadvantage of this arrangement is that excess space has been taken up by the multilayer pad 12, thereby reducing the possible density of the remaining multilayer pads (not shown) on the ceramic substrate.

Figure 3:
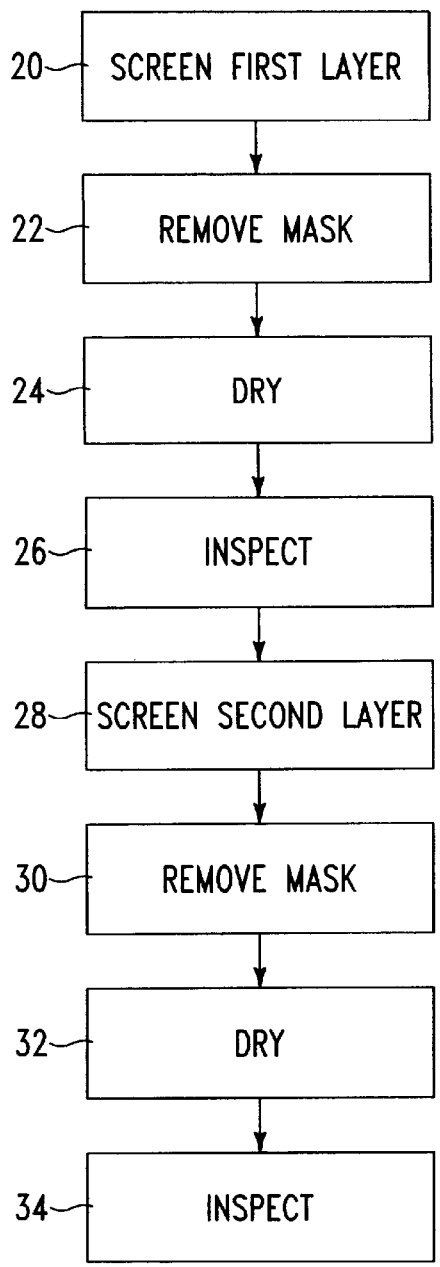
FIG. 3 is a flow chart showing the process flow for the prior art process of multiple screenings to form a multilayer pad.

The prior art process for producing a two-layer multilayer pad is illustrated in FIG. 3. The first layer is screened 20 through a mask onto a ceramic greensheet. The mask is removed 22 followed by drying 24 and inspection 26 of the screened features. Thereafter, the second layer is screened 28 through a mask onto the first layer. The mask is then removed 30 followed by drying 32 and inspection 34 of the screened features. Finally the greensheet is stacked with other ceramic greensheets, laminated and sintered.

It doesn't matter whether the same mask or different masks are used in the prior art process to screen both of the layers, the result will be the same, namely, misalignment between the two layers due to positional error.

Figure 4:
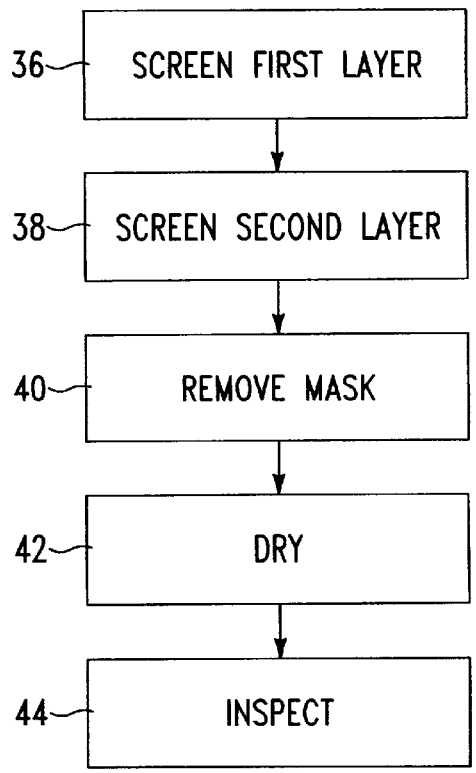
FIG. 4 is a flow chart showing the process flow for the process according to the present invention of multiple screenings to form a multilayer feature.

Referring now to FIG. 4, the process according to the present invention is illustrated. The first layer of the multilayer feature is screened 36 onto an electronic substrate article with the mask. Without moving the mask, the second layer is screened 38 through the same mask.

Referring now to FIG. 5A, mask 48 having feature opening 50 in line with via 47 is situated on electronic substrate article 46. Mask 48 is preferably a metal mask suitable for extrusion screening but it is contemplated within the scope of the present invention that a mesh mask suitable for silk screen printing could also be used, although it is clearly not preferred because of the inherent movement of the mesh mask during the silk screen printing process. Nozzle 52 is poised to provide a quantity of paste for screening.

The preferred screening apparatus, including the nozzle, is described in more detail in Applicants' RELATED APPLICATION. Nozzle 52 should be relatively pliable for reasons which will become apparent hereafter. Suitable materials for nozzle 52 could be polyurethane, elastomers, thermoplastics, natural rubber, silicone, TEFLON (TEFLON, a tetrafluoroethylene (TFE) compound is a trademark of E.I. duPont de Nemours & Co.) or other similar materials.

Nozzle 52 will screen the paste into feature opening 50. Due to the pliable nature of the nozzle 52, part of the screened paste is scooped out by the pliable nozzle 52 leaving layer 54 only partially filling the feature opening 50. Nozzle 52 will also wipe the mask, removing any paste residue. The resulting unfilled portion 56 of feature opening 50 will be filled by the second layer. If unfilled portion 56 were not present, there would be no place for the second layer to fill in the feature opening 50. As can be seen in FIG. 5B, the first layer 54 will fill the bottom portion of feature opening 50 and will also usually fill the top portion of feature opening 50 along the walls of feature opening 50. The resulting unfilled portion 56 is dish-shaped.

It is not necessary to dry layer 54 before proceeding to the next screening step.

Next, nozzle 58 will screen the second layer 60 of paste into feature opening 50 to fill it as illustrated in FIG. 5C. Nozzle 58 is chosen to be made of a hard material such as a carbide, tool steel or ceramic material. The purpose of nozzle 58 is to fill the remaining portion 56 of feature opening 50. If nozzle 58 were pliable like nozzle 52, paste would be screened into feature opening 50 and then scooped out so that the feature opening would remain unfilled.

The pastes used are preferably metal-containing (conducting) pastes although insulative (nonconducting) paste or pastes, or combinations of metal-containing pastes and insulative pastes, could be used for a given application.

Also, the pastes for the different layers will typically differ from layer to layer so that the most advantageous properties can be developed for each layer. That is, the first layer 54 may be formulated for adhesion to the electronic substrate article 46 while the second layer 60 may be formulated for soldering or brazing.

The present invention is most suitable for a two-layer multilayer feature. It is possible, however, by varying the hardness of the nozzles 52, 58 to build up three or more layers according to the present invention.

Referring back to FIG. 4, the mask is removed 40 followed by drying 42 and inspection 44 of the screened features.

In a preferred embodiment of the present invention, the multilayer feature shown in FIGS. 5A, 5B and 5C is a multilayer termination pad formed on a ceramic greensheet 46. Subsequent to the step of inspecting, the ceramic greensheet 46 with the multilayer termination pad would be stacked with other appropriate greensheets having appropriate wiring features (as is well known to those skilled in the art), laminated under pressure and then sintered to form a multilayer ceramic substrate having at least one multilayer termination pad.

The resulting multilayer feature is shown in FIG. 6A prior to laminating and in FIG. 6B after laminating and sintering. As a result of laminating, the exposed part of first layer 54 becomes greater. As can be seen, first layer 54 completely captures second layer 60. Due to the fact that the screening mask is never moved between screening steps, there is complete alignment between first layer 54 and second layer 60. This would be true even if first layer 54 did not rise up along the walls of the feature opening as shown in FIG. 5B.

Surprisingly, there is little or no contamination of the first layer 54 by the second layer 60 even though the paste for the second layer 60 can be screened on while the paste for the first layer 54 is still wet. The fact that first nozzle 52 wipes the mask 48 after screening is useful in avoiding intermixing of the first layer 54 and the second layer 60.

Instead of forming the multilayer termination pads on ceramic greensheets, the multilayer termination pads could be formed on a greensheet laminate, i.e. a stack of laminated greensheets, a sintered ceramic substrate, or an organic substrate, in which case the process flow of FIG. 4 would still apply. After inspection, the greensheet laminate and multilayer termination pads would be sintered while the sintered ceramic substrate and multilayer termination pads would be resintered. As to the organic substrate the preferred multilayer termination pad would comprise solder paste. After inspection, the organic substrate and multilayer termination pad would be heated to cause reflow of the solder.

Figure 7:
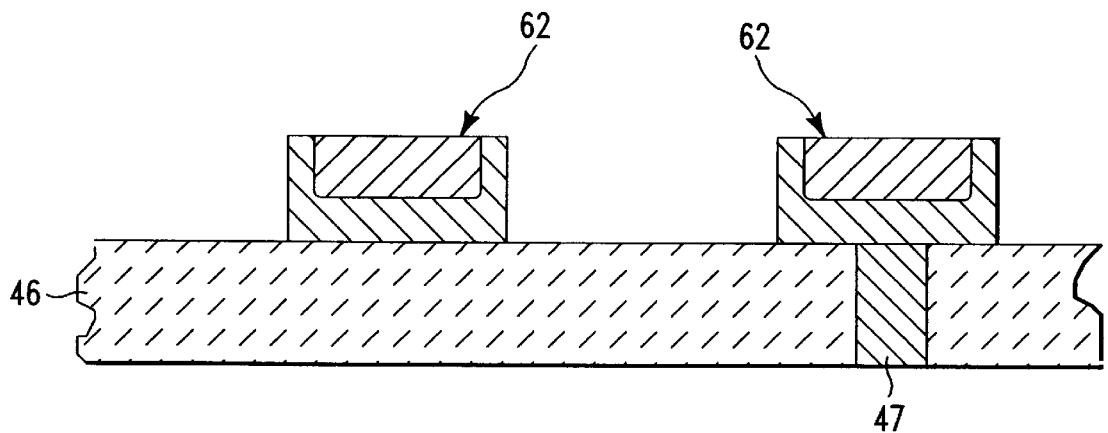
FIG. 7 is a schematical cross-sectional view of a second multilayer feature produced according to the present invention.
Figure 8:
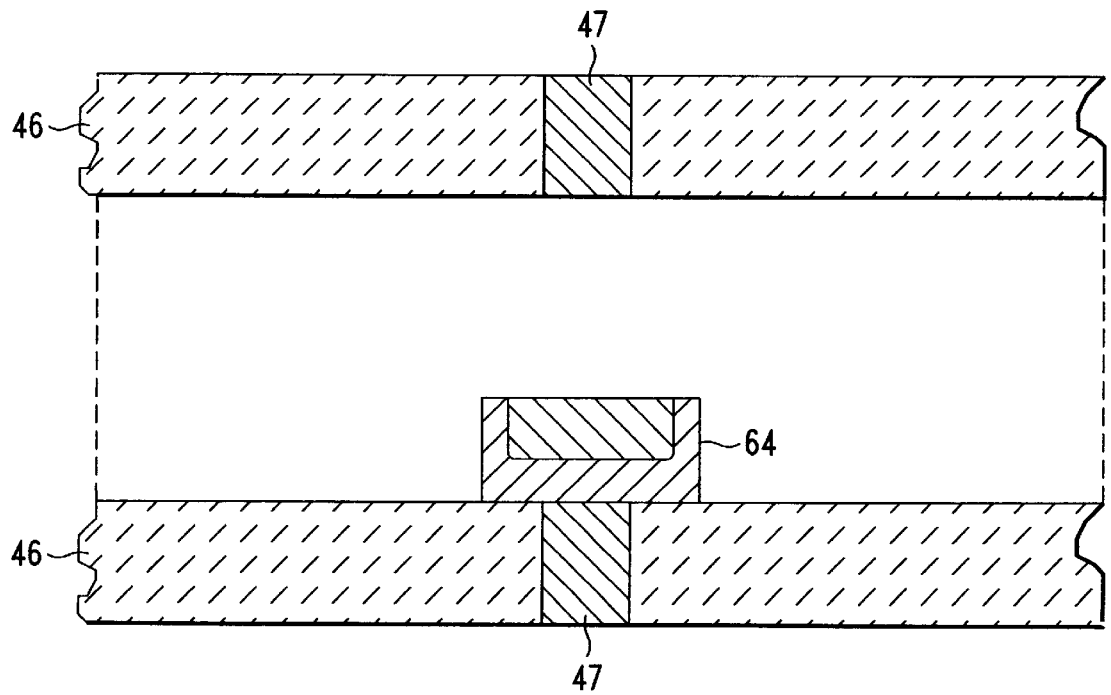
FIG. 8 is a schematical cross-sectional view of a third multilayer feature produced according to the present invention.

Too, instead of forming multilayer termination pads, the present invention could be utilized to form other multilayer features. Illustrated in FIG. 7 is another embodiment of the present invention in which multilayer lines or wiring patterns 62, one of which contacts via 47, are formed on ceramic article 46. Illustrated in FIG. 8 are ceramic articles 46, preferably ceramic greensheets, wherein one ceramic article 46 contains a multilayer feature 64 which in conjunction with via 47 forms an in-line capacitor. In practice, the two ceramic articles 46 in FIG. 8 would be adhered together, or in the case of ceramic greensheets, would be laminated and sintered.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a multi-layer feature on an electronic substrate article, the method comprising the steps of
    a. placing a screening mask having at least one aperture over the electronic substrate article;
    b. screening a first paste with a pliable nozzle through the at least one aperture of the screening mask to form a first layer of the multi-layer feature directly on the electronic substrate article without any intervening layer of material whereby said pliable nozzle scoops out a portion of said first paste wherein said first paste only partially fills the at least one aperture;
    c. screening a second paste with a non-pliable nozzle through the same at least one aperture of the same screening mask used in the first screening step and onto the first paste to form a second layer of the multi-layer feature in alignment with the first layer of the multi-layer feature, wherein the screening mask has not been moved between the two screening steps; and
    d. removing the screening mask.

2. The method of claim 1 further comprising the step of heating the multi-layer feature.

3. The method of claim 1 wherein in the first screening step, the paste only partially fills the at least one aperture of the screening mask.

4. A method of forming a multi-layer feature on an electronic substrate article, the method comprising the steps of:
    a. placing a screening mask having at least one aperture over the electronic substrate article;
    b. screening a first paste with a pliable nozzle through the at least one aperture of the screening mask to form a first layer of the multi-layer feature whereby said pliable nozzle scoops out a portion of said first paste, wherein the first paste only partially fills the at least one aperture of the screening mask;
    c. screening a second paste with a non-pliable nozzle through the same at least one aperture of the same screening mask used in the first screening step and onto the first paste to form a second layer of the multi-layer feature in alignment with the first layer of the multi-layer feature, wherein the screening mask has not been moved between the two screening steps, and wherein the second paste fills the remainder of the at least one aperture of the screening mask; and
    d. removing the screening mask.

5. The method of claim 1 wherein the first paste is wet when the second paste is screened onto it.

6. The method of claim 1 wherein the first and second pastes are metal-containing pastes.

7. The method of claim 1 wherein the first and second pastes are insulative pastes.

8. The method of claim 1 wherein one of the first and second pastes is a metal-containing paste and the other of the first and second pastes is an insulative paste.

9. The method of claim 1 wherein the electronic substrate article is an organic article.

10. The method of claim 2 wherein the electronic substrate article is an organic article, the first and second pastes comprise solder and the step of heating the multi-layer feature causes reflow of the solder layers.

11. The method of claim 2 wherein the electronic substrate article is a ceramic substrate and the step of heating causes sintering of the multilayer feature.

12. The method of claim 11 wherein the ceramic substrate is a ceramic greensheet and the method further comprises, prior to the step of heating:
    screening a paste onto at least a second ceramic greensheet to form a wiring feature;
    removing the screening mask; and
    stacking and laminating the ceramic greensheets.

13. The method of claim 11 wherein the ceramic substrate is a ceramic greensheet laminate.

14. The method of claim 11 wherein the ceramic substrate is a sintered ceramic substrate.

15. The method of claim 1 wherein the screening mask is a metal mask.

16. The method of claim 1 wherein the screening mask is that used in silk screen printing.

17. The method of claim 1 wherein the first and second steps of screening are by extrusion screening.

18. The method of claim 1 wherein the first and second steps of screening are by silk screen printing.

19. The method of claim 1 wherein the multi-layer feature is a termination pad.

20. The method of claim 1 wherein the multi-layer feature is a wiring line.

21. The method of claim 1 wherein the multi-layer feature is part of a capacitor.

* * * * *